(12) United States Patent
Noh et al.

(10) Patent No.: US 11,088,690 B2
(45) Date of Patent: Aug. 10, 2021

(54) SWITCH

(71) Applicant: AUTONICS CORPORATION, Busan (KR)

(72) Inventors: Jongeun Noh, Busan (KR); Byounguk Lim, Busan (KR)

(73) Assignee: AUTONICS CORPORATION, Busan (KR)

( * ) Notice: Subject to any disclaimer, the term of this patent is extended or adjusted under 35 U.S.C. 154(b) by 0 days.

(21) Appl. No.: 16/477,358

(22) PCT Filed: Dec. 12, 2018

(86) PCT No.: PCT/KR2018/015793
§ 371 (c)(1),
(2) Date: Jul. 11, 2019

(87) PCT Pub. No.: WO2020/075915
PCT Pub. Date: Apr. 16, 2020

(65) Prior Publication Data
US 2020/0119732 A1    Apr. 16, 2020

(30) Foreign Application Priority Data

Oct. 12, 2018  (KR) .................. 10-2018-0121649

(51) Int. Cl.
*H03K 17/95*     (2006.01)
*G01D 5/14*     (2006.01)
*H05K 1/00*     (2006.01)

(52) U.S. Cl.
CPC ......... *H03K 17/9517* (2013.01); *G01D 5/145* (2013.01); *H03K 17/9505* (2013.01)

(58) Field of Classification Search
CPC ........ H01L 21/00; H01L 2221/00; H02J 1/00; G05B 1/00; H01F 1/00; H05K 1/00; H05K 2201/00
See application file for complete search history.

(56) References Cited

U.S. PATENT DOCUMENTS

2008/0122518 A1\* 5/2008 Besser .................. H02J 7/35
                                                        327/518
2010/0289484 A1\* 11/2010 Quinn .................. G01D 5/145
                                                        324/207.2
(Continued)

FOREIGN PATENT DOCUMENTS

JP    7-78538 A    3/1995
JP    2005-174667 A    6/2005
(Continued)

*Primary Examiner* — Jermele M Hollington
*Assistant Examiner* — Temilade S Rhodes-Vivour
(74) *Attorney, Agent, or Firm* — Birch, Stewart, Kolasch & Birch, LLP

(57) ABSTRACT

A switch is disclosed. The switch includes a body; and an actuator configured to provide a magnetic force to the body and induce an electrical switching of the body, wherein the body includes a housing with a first surface; and a plurality of hall sensors sequentially disposed adjacent to the first surface, wherein the actuator includes a case with a second surface; and a first magnetic body and a second magnetic body sequentially disposed adjacent to the second surface, wherein the first magnetic body includes a first polarity; and a second polarity opposite to the first magnetic body, wherein the second magnetic body includes a third polarity; and a fourth polarity opposite to the third magnetic body, wherein the first polarity, the second polarity, the third polarity, and the fourth polarity are sequentially disposed along the second surface.

11 Claims, 12 Drawing Sheets

(56) References Cited

U.S. PATENT DOCUMENTS

| | | | | |
|---|---|---|---|---|
| 2013/0106195 A1* | 5/2013 | Kusch | .................. | H02J 7/1423 |
| | | | | 307/82 |
| 2014/0015596 A1* | 1/2014 | Martin | .................. | H03K 17/97 |
| | | | | 327/517 |
| 2014/0167501 A1* | 6/2014 | Marosi | .................... | G06F 1/266 |
| | | | | 307/11 |
| 2015/0377648 A1* | 12/2015 | Sirohiwala | ............ | G01D 5/165 |
| | | | | 324/207.2 |
| 2016/0329705 A1* | 11/2016 | Lacaux | .................. | H02M 1/44 |
| 2017/0146256 A1* | 5/2017 | Alexander | ............... | G05B 1/00 |
| 2017/0244245 A1* | 8/2017 | Hajje | ..................... | H02M 3/07 |

FOREIGN PATENT DOCUMENTS

| | | |
|---|---|---|
| JP | 2006-80001 A | 3/2006 |
| JP | 2013-504161 A | 2/2013 |
| KR | 10-2008-0084577 A | 9/2008 |

\* cited by examiner

[Figure 1]
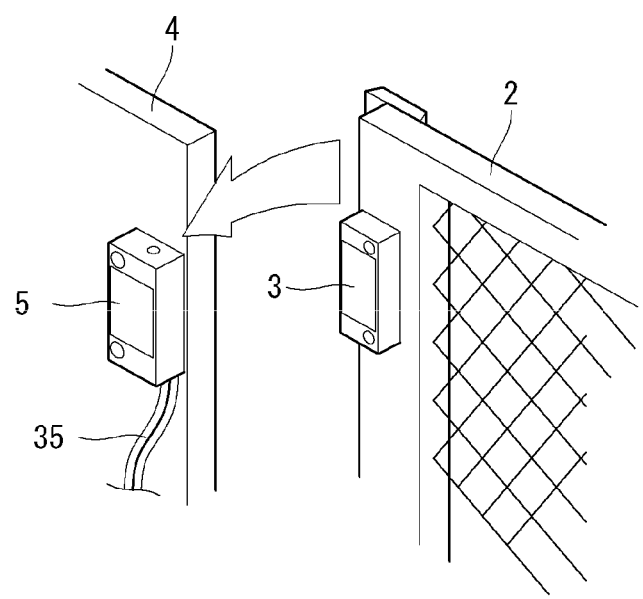

【Figure 2】
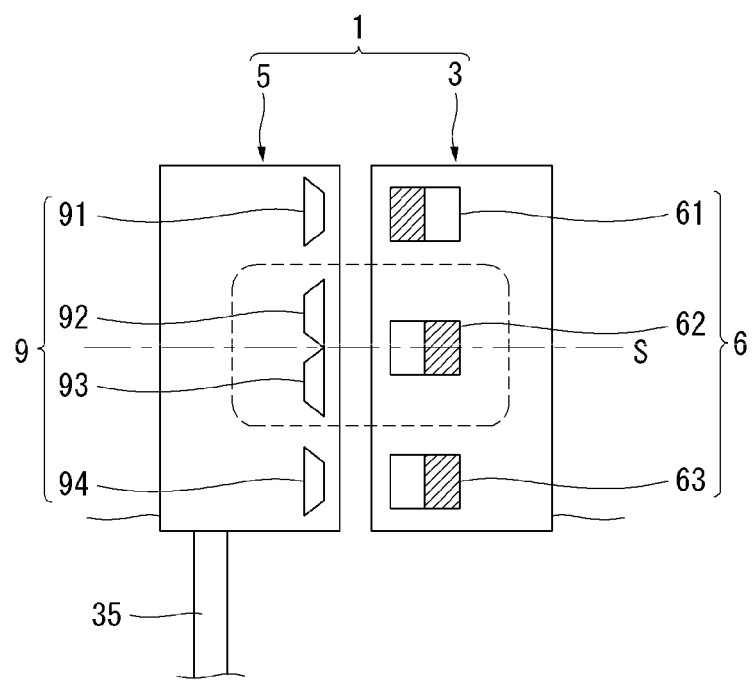

【Figure 3】
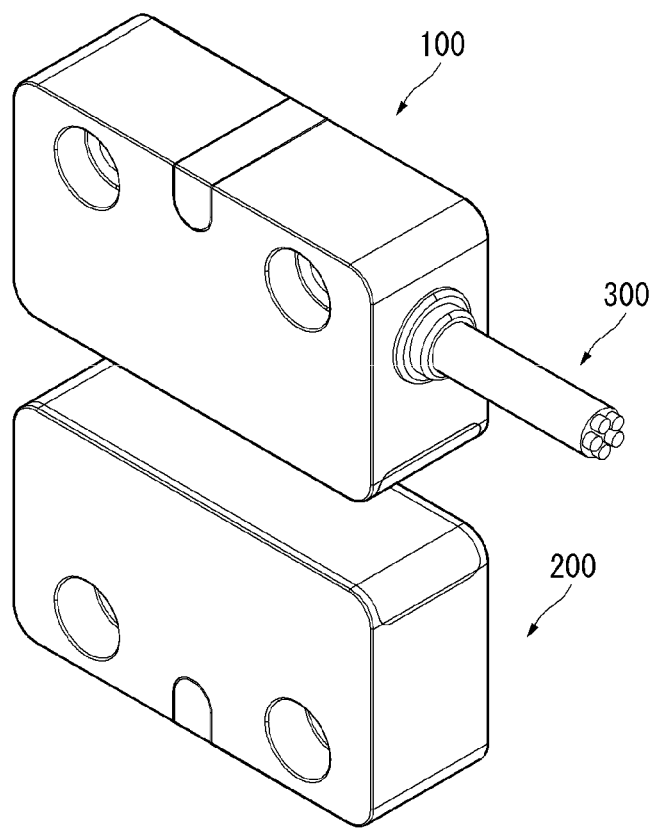

【Figure 4】
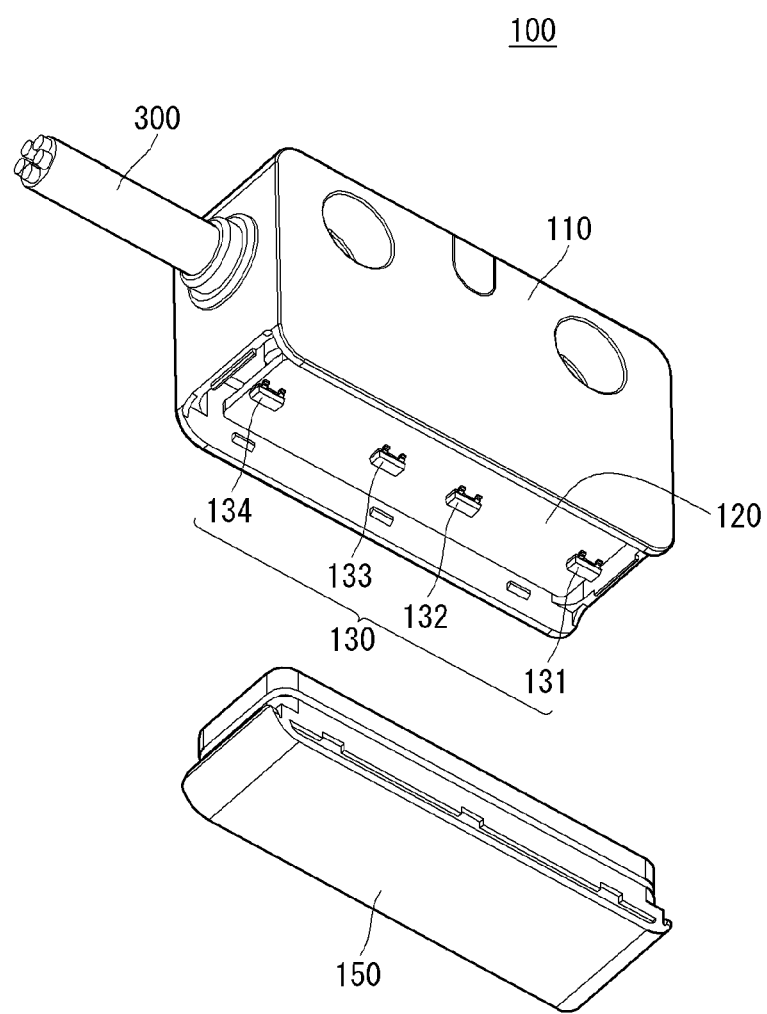

[Figure 5]
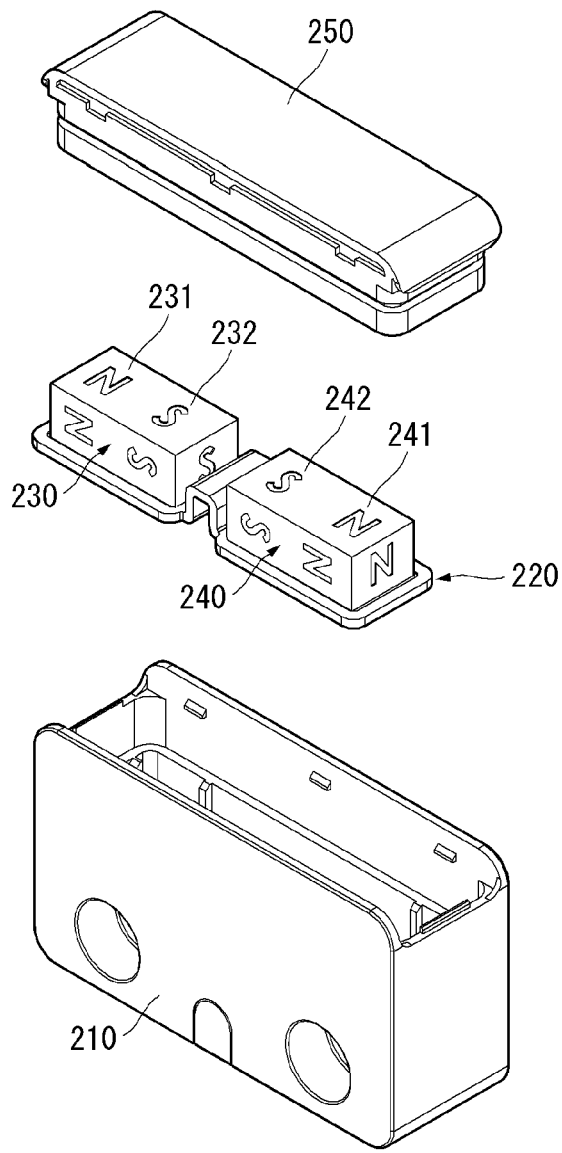

[Figure 6]
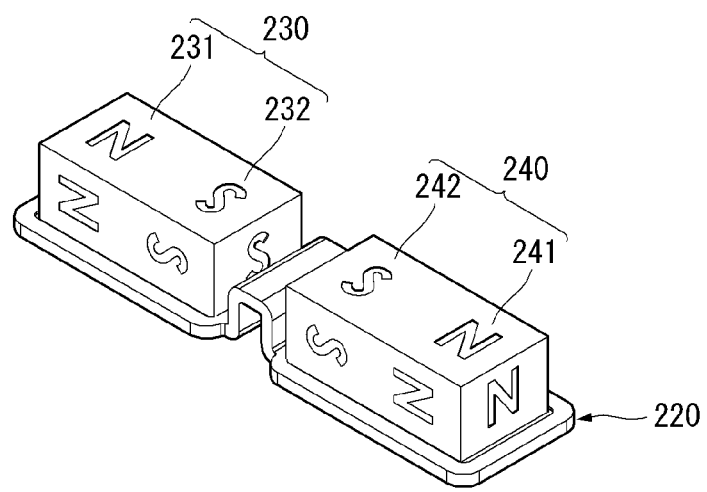
[Figure 7]
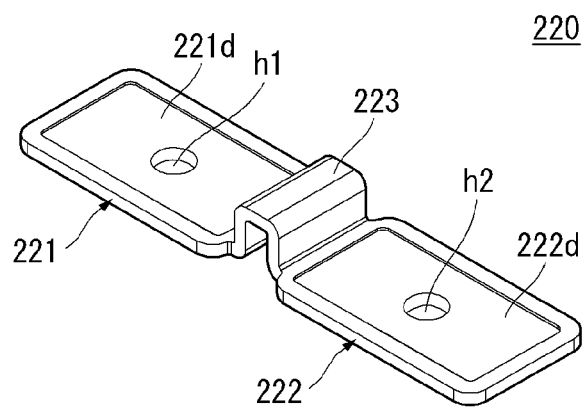

[Figure 8]
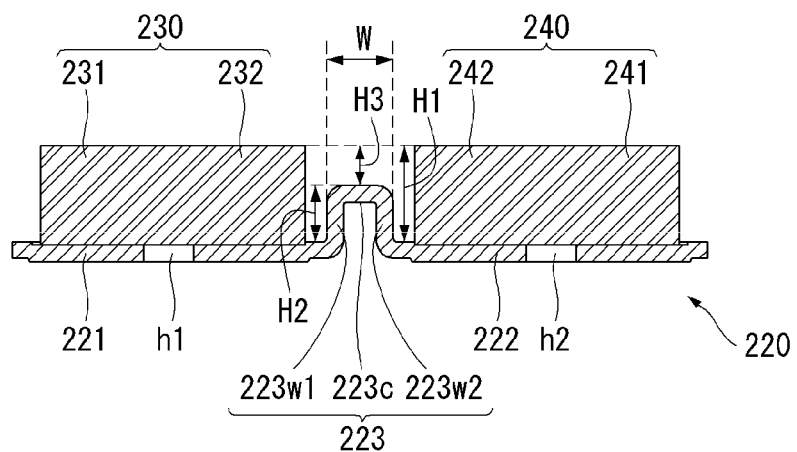
[Figure 9]
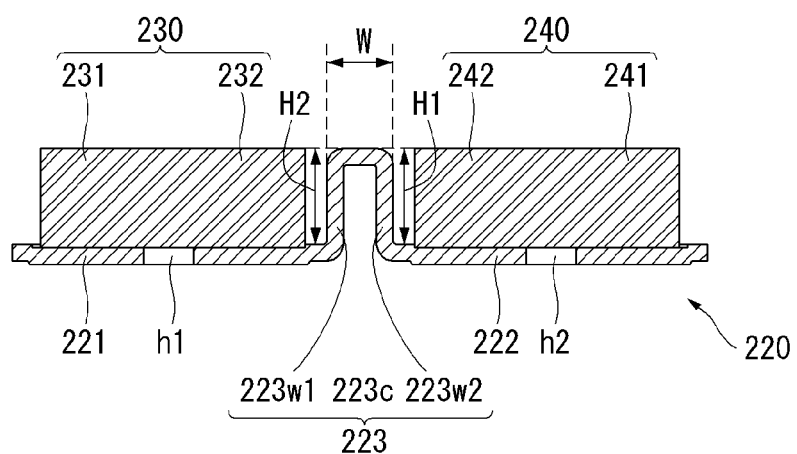

【Figure 10】
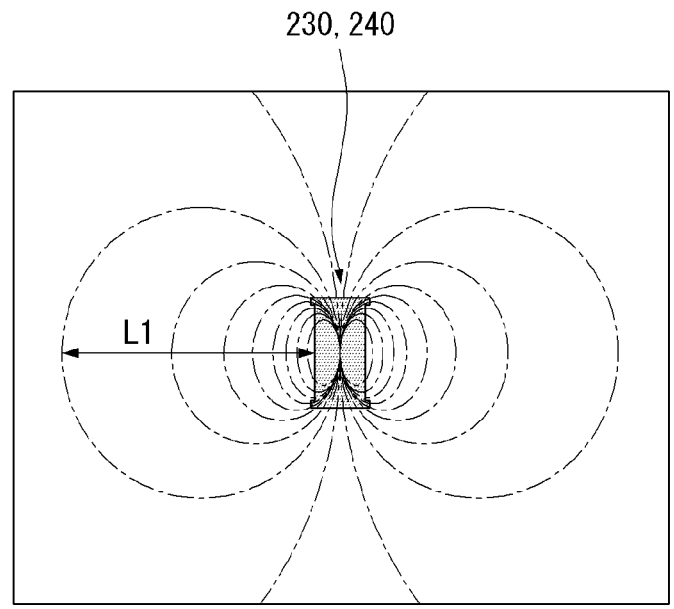
【Figure 11】
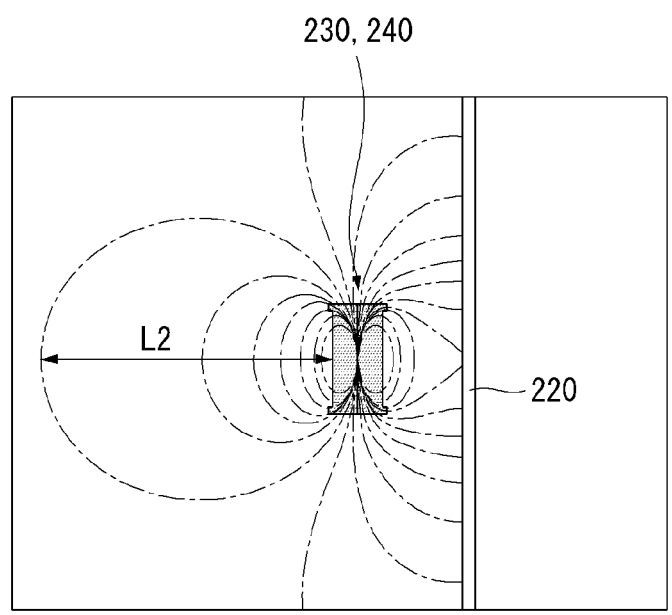

【Figure 12】
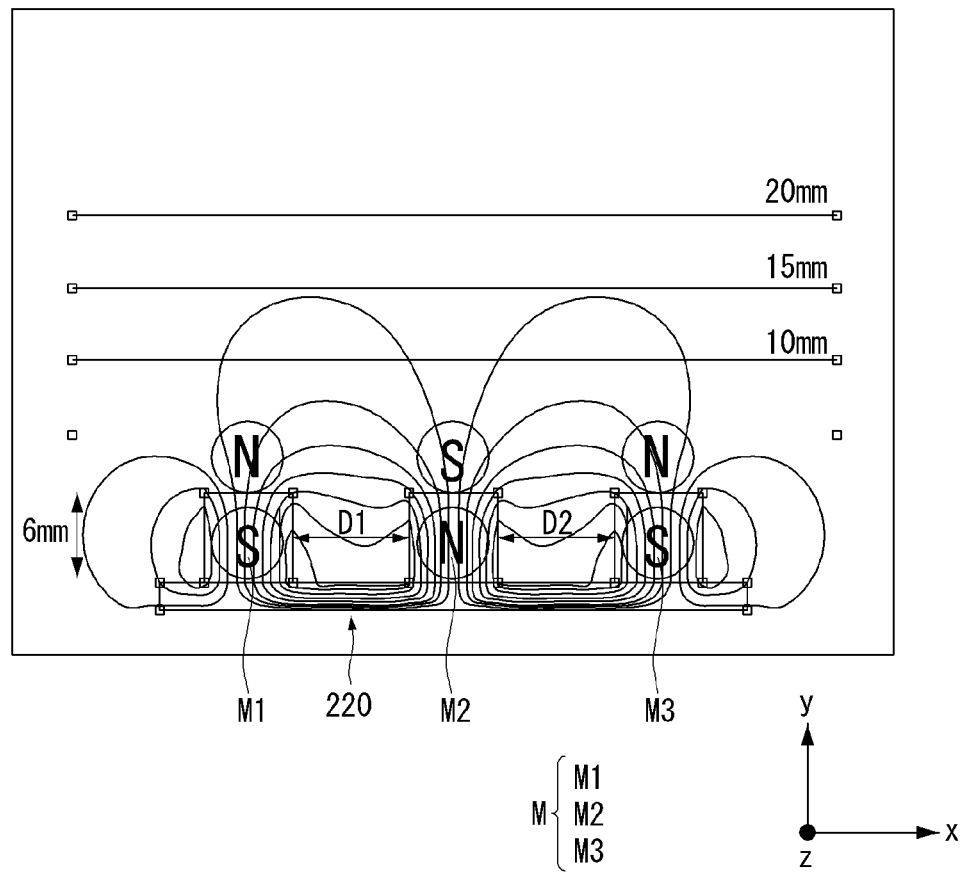

【Figure 13】
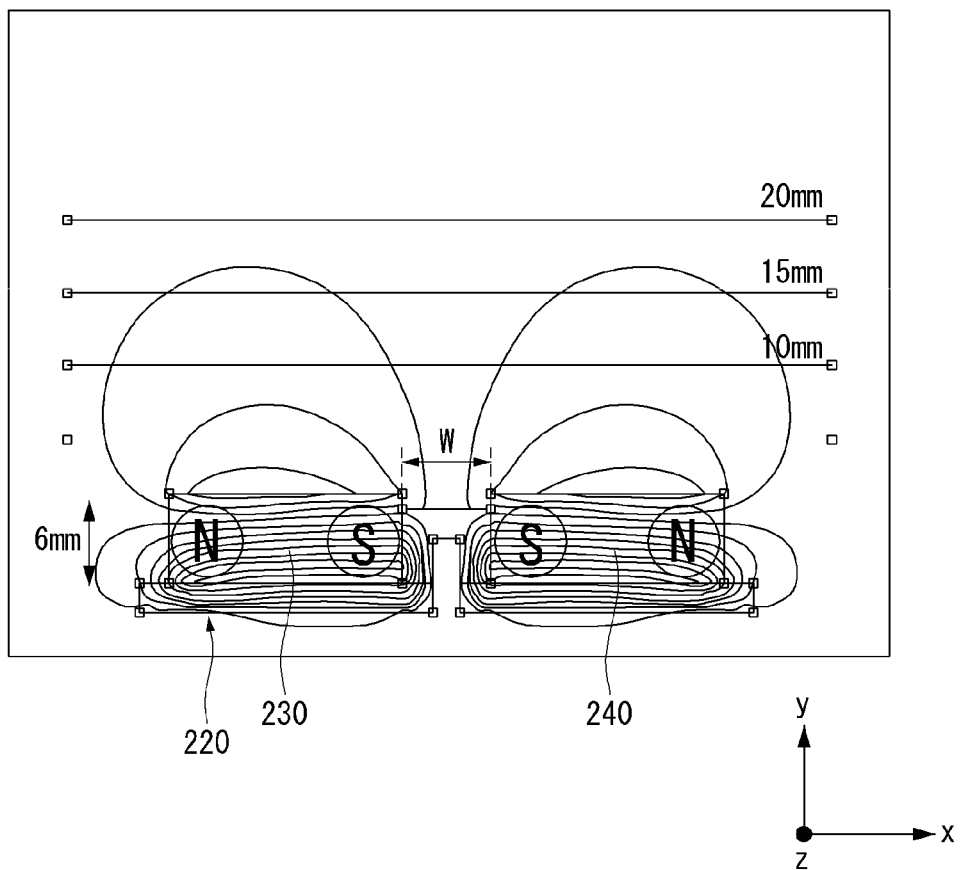

【Figure 14】
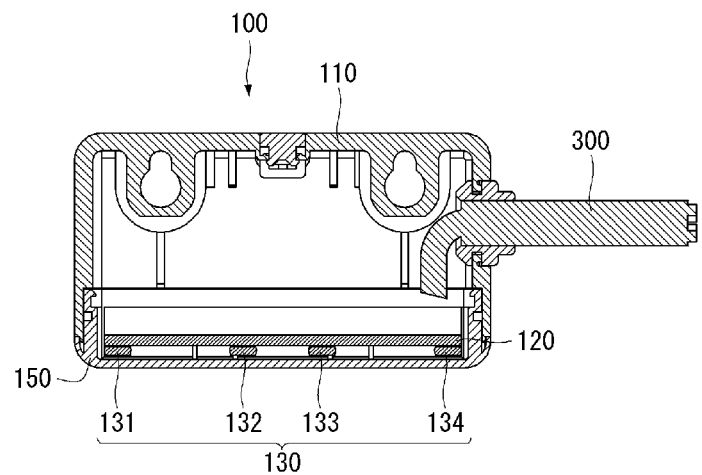
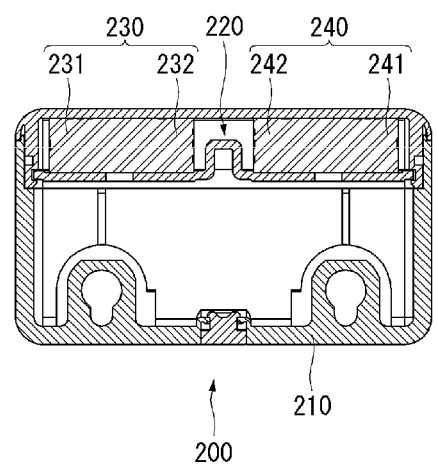

【Figure 15】
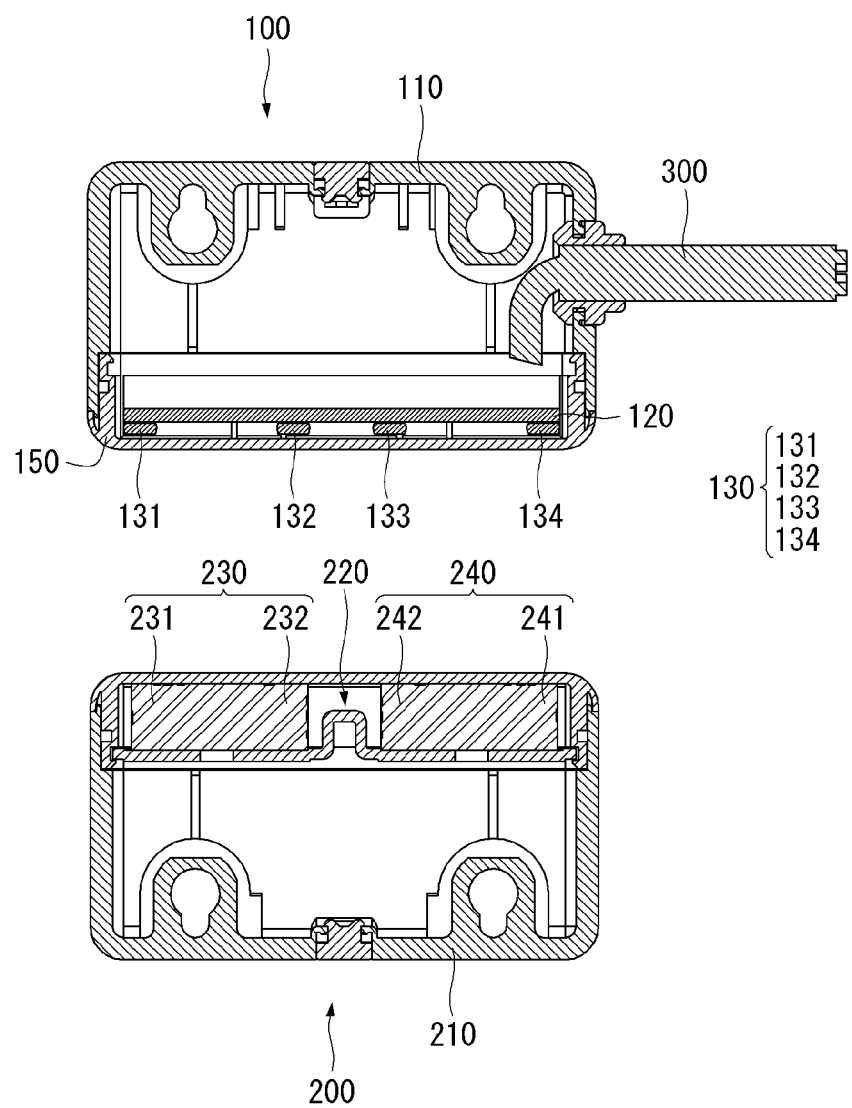

SWITCH

CROSS REFERENCE TO RELATED APPLICATIONS

This application is the National Phase of PCT International Application No. PCT/KR2018/015793, filed on Dec. 12, 2018, which claims priority under 35 U.S.C. 119(a) to Patent Application No. 10-2018-0121649, filed in the Republic of Korea on Oct. 12, 2018, all of which are hereby expressly incorporated by reference into the present application.

TECHNICAL FIELD

The present disclosure relates to a switch. More particularly, the present disclosure relates to a non-contact switch.

BACKGROUND ART

A switch is a device controlling the flow of a current. A power source and an actuator can be separated for the stability of a system, and the switch electrically connects the power source to the actuator.

As a kind of switch, there is a non-contact switch using a magnetic force. Because the non-contact switch does not have a mechanical contact, the non-contact switch does not have abrasion between contacts, has the good durability, and does not generate dust due to abrasion. Hence, the non-contact switch is suitable for an environment requiring dust proof.

Referring to FIGS. 1 and 2, a switch 1 may be used to sense opening and closing of a door 2. A body 5 may be installed on a wall 4, and an actuator 3 may be installed on the door 2. The body 5 may include a plurality of hall sensors 9, and the actuator 3 may include a plurality of magnets 6. If the door 2 approaches the wall 4, the hall sensors 9 sense magnetic field lines generated by the magnets 6 and can detect the opening or closing of the door 2. Cables 35 may be electrically connected to the plurality of hall sensors 9.

Each of the plurality of magnets 6 may be disposed to provide a different polarity. For example, a first magnet 61 may be configured such that a N pole faces the front and is opposite to the body 5 and a S pole faces the rear, a second magnet 62 may be configured such that a S pole faces the front and is opposite to the body 5 and a N pole faces the rear, and a third magnet 63 may be configured such that a N pole faces the front and is opposite to the body 5 and a S pole faces the rear.

A first hall sensor 91 may sense magnetic field lines provided by the first magnet 61, a second hall sensor 92 and/or a third hall sensor 93 may sense magnetic field lines provided by the second magnet 62, and a fourth hall sensor 94 may sense magnetic field lines provided by the third magnet 63.

However, the switch needs to maintain a distance between the magnets at a predetermined distance or more in order to prevent the cancellation of magnetic field lines between the magnets, and there is a problem that miniaturization of the switch is difficult to achieve. Further, if the number of magnets is increased to improve sensitivity and/or reliability of the switch, there are problems that the size of the switch becomes large and the production cost increases.

Recently, many studies have been conducted to improve the sensitivity of the switch, reduce the size of the switch, and reduce its production cost.

DISCLOSURE

Technical Problem

An object of the present disclosure is to address the above-described and other problems. Another object of the present disclosure is to improve sensitivity and/or reliability of a switch.

Another object of the present disclosure is to achieve miniaturization of a switch and reduce its production cost.

Technical Solution

To achieve the above-described and other objects, in one aspect of the present disclosure, there is provided a switch comprising a body; and an actuator configured to provide a magnetic force to the body and induce an electrical switching of the body, wherein the body includes a housing with a first surface; and a plurality of hall sensors sequentially disposed adjacent to the first surface, wherein the actuator includes a case with a second surface; and a first magnetic body and a second magnetic body sequentially disposed adjacent to the second surface, wherein the first magnetic body includes a first polarity; and a second polarity opposite to the first polarity, wherein the second magnetic body includes a third polarity; and a fourth polarity opposite to the third polarity, wherein the first polarity, the second polarity, the third polarity, and the fourth polarity are sequentially disposed along the second surface.

According to another aspect of the present disclosure, the second polarity of the first magnetic body may face the third polarity of the second magnetic body.

According to another aspect of the present disclosure, the second polarity of the first magnetic body may be the same as the third polarity of the second magnetic body, and the first polarity of the first magnetic body may be the same as the fourth polarity of the second magnetic body.

According to another aspect of the present disclosure, the plurality of hall sensors may include a first hall sensor corresponding to the first polarity; a second hall sensor corresponding to the second polarity; a third hall sensor corresponding to the third polarity; and a fourth hall sensor corresponding to the fourth polarity.

According to another aspect of the present disclosure, the switch may further comprise a plate positioned inside the case, the first magnetic body and the second magnetic body may be positioned between the second surface of the case and the plate, and the plate may include an isolation wall between the first magnetic body and the second magnetic body.

According to another aspect of the present disclosure, the plate may include a metal.

According to another aspect of the present disclosure, a distance between the first hall sensor and the second hall sensor may be greater than a distance between the second hall sensor and the third hall sensor.

According to another aspect of the present disclosure, the distance between the first hall sensor and the second hall sensor may be substantially equal to a distance between the third hall sensor and the fourth hall sensor.

Advantageous Effects

According to at least one aspect of the present disclosure, the present disclosure can improve sensitivity and/or reliability of a switch.

According to at least one aspect of the present disclosure, the present disclosure can achieve miniaturization of a switch and reduce its production cost.

DESCRIPTION OF DRAWINGS

FIGS. 1 and 2 illustrate an example of a non-contact switch related to the present disclosure.

FIGS. 3 to 9 illustrate examples of a switch according to an embodiment of the disclosure.

FIGS. 10 to 13 illustrate examples of distribution of magnetic field lines according to an embodiment of the disclosure.

FIGS. 14 and 15 illustrate examples of a switch operation according to an embodiment of the disclosure.

MODE FOR INVENTION

Reference will now be made in detail to embodiments of the disclosure, examples of which are illustrated in the accompanying drawings. Wherever possible, the same reference numbers will be used throughout the drawings to refer to the same or like parts.

In general, a suffix such as "module" and "unit" may be used to refer to elements or components. Use of such a suffix herein is merely intended to facilitate description of the specification, and the suffix itself is not intended to give any special meaning or function.

It will be noted that a detailed description of known arts will be omitted if it is determined that the detailed description of the known arts can obscure the embodiments of the disclosure.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

The terms including an ordinal number such as first, second, etc. may be used to describe various components, but the components are not limited by such terms. The terms are used only for the purpose of distinguishing one component from other components.

When an arbitrary component is described as "being connected to" or "being coupled to" another component, this should be understood to mean that still another component(s) may exist between them, although the arbitrary component may be directly connected to or directly coupled to another component. In contrast, when an arbitrary component is described as "being directly connected to" or "being directly coupled to" another component, this should be understood to mean that no component exists between them.

A singular expression can include a plural expression as long as it does not have an apparently different meaning in context.

In the present application, the terms "include" and "have" should be understood to be intended to designate that illustrated features, numbers, steps, operations, components, parts or combinations thereof are present and not to preclude the existence of one or more different features, numbers, steps, operations, components, parts or combinations thereof, or the possibility of the addition thereof.

Referring to FIG. 3, a body 100 and an actuator 200 may make a pair. A cable 300 may be connected to the body 100 and may electrically connect the body 100 to an external device (not shown). The body 100 may provide electrical switching. The actuator 200 may control the switching of the body 100. The actuator 200 can control the switching of the body 100 while the actuator 200 approaches or distances the body 100.

Referring to FIG. 4, housings 110 and 150, a case 110, and a cover 150 may be terms used to be distinguished from each other in embodiments and may be used interchangeably.

The body 100 may include housings 110 and 150. A PCB 120 may be mounted inside the housings 110 and 150. A plurality of hall sensors 130 may be mounted on the PCB 120. The plurality of hall sensors 130 may be disposed while maintaining a predetermined distance between them. For example, four hall sensors 130 may be sequentially disposed.

The plurality of hall sensors 130 may sense magnetic forces of different polarities. For example, a first hall sensor 131 may sense a N pole or polarity change in the N pole. A second hall sensor 132 may sense a S pole or polarity change in the S pole. A third hall sensor 133 may sense a S pole or polarity change in the S pole. A fourth hall sensor 134 may sense a N pole or polarity change in the N pole.

The cable 300 may be electrically connected to the plurality of hall sensors 130 through the PCB 120.

The housings 110 and 150 may include a case 110 and a cover 150. The PCB 120 may be installed or mounted inside the case 110. One surface of the case 110 may be opened, and the cover 150 may cover the opened one surface of the case 110. The opened one surface of the case 110 or the surface of the housings 110 and 150 provided by the cover 150 may be referred to as a first surface. The plurality of hall sensors 130 may be positioned adjacent to the first surface.

Referring to FIG. 5, housings 210 and 250, a case 210, and a cover 250 may be terms used to be distinguished from each other in embodiments and may be used interchangeably.

The actuator 200 may include the housings 210 and 250. A plate 220 may be mounted inside the housings 210 and 250. A plurality of magnetic bodies 230 and 240 may be positioned or placed on the plate 220. The plurality of magnetic bodies 230 and 240 may be disposed while maintaining a predetermined distance between them. For example, two magnetic bodies 230 and 240 may be sequentially disposed.

The housings 210 and 350 may include a case 210 and a cover 250. The plate 220 may be installed or mounted inside the case 210. One surface of the case 210 may be opened, and the cover 250 may cover the opened one surface of the case 210. The opened one surface of the case 210 or the surface of the housings 210 and 250 provided by the cover 250 may be referred to as a second surface. The plurality of magnetic bodies 230 and 240 may be positioned adjacent to the second surface.

Referring to FIGS. 6 and 7, the plurality of magnetic bodies 230 and 240 may include a first magnetic body 230 and a second magnetic body 240. The first magnetic body 230 may include a first polarity 231 and a second polarity 232, and the second magnetic body 240 may include a third polarity 242 and a fourth polarity 241. For example, the first polarity 231 may be a N pole, the second polarity 232 may be a S pole, the third polarity 242 may be a S pole, and the fourth polarity 241 may be a N pole. The second polarity 232 and the third polarity 242 may be opposite to each other.

The plate 220 may include a first flat portion 221, a second flat portion 222, and an isolation wall 223. For example, the plate 220 may include a metal, and the metal may be a metal material. The first flat portion 221 and the second flat portion 222 may be adjacent to each other, and the isolation wall 223 may be positioned between the first flat portion 221 and the second flat portion 222 and may couple the first flat portion 221 and the second flat portion 222.

The first flat portion 221 may include a first seating portion 221d, and the second flat portion 222 may include a second seating portion 222d. The first seating portion 221d may be formed by pressing or depressing the first flat portion 221, and the second seating portion 222d may be formed by pressing or depressing the second flat portion 222. A first through hole h1 may be formed in the first flat portion 221 or the first seating portion 221d, and a second through hole h2 may be formed in the second flat portion 222 or the second seating portion 222d.

Referring to FIG. 8, the isolation wall 223 may include a first wall 223w1, a second wall 223w2, and a bridge 223c. The first wall 223w1 may be bent and extended from the first flat portion 221, the second wall 223w2 may be bent and extended from the second flat portion 222, and the bridge 223c may connect the first wall 223w1 and the second wall 223w2. The first wall 223w1 may face or be opposite to the second wall 223w2.

A height H2 of the isolation wall 223 may be less than a height H1 of the first magnetic body 230 or the second magnetic body 240. The height H2 of the isolation wall 223 may be greater than a space height H3. A width W or a length W of the bridge 223c may maintain a gap between the first magnetic body 230 and the second magnetic body 240. For example, the first magnetic body 230 may provide a repulsive force to the second magnetic body 240, and the isolation wall 223 may reduce the repulsive force.

Referring to FIG. 9, a height H2 of the isolation wall 223 may be substantially the same as a height H1 of the first magnetic body 230 or the second magnetic body 240. A width W or a length W of the bridge 223c may maintain a gap between the first magnetic body 230 and the second magnetic body 240. For example, the first magnetic body 230 may provide a repulsive force to the second magnetic body 240, and the isolation wall 223 may more reduce the repulsive force than the repulsive force described with reference to FIG. 8.

FIG. 10 illustrates distribution of magnetic field lines provided by the first magnetic body 230 or the second magnetic body 240. FIG. 11 illustrates distribution of magnetic field lines provided by the first magnetic body 230 or the second magnetic body 240 when the plate 220 is positioned on one side of the first magnetic body 230 or the second magnetic body 240. It can be seen from FIGS. 10 and 11 that a distance L2 of magnetic field lines provided by the first magnetic body 230 or the second magnetic body 240 is increased more than a distance L1 of magnetic field lines provided by the first magnetic body 230 or the second magnetic body 240 due to the plate 220.

FIG. 12 illustrates distribution of magnetic field lines provided by a plurality of magnetic bodies M that is disposed on the plate 220. A first magnetic body M1 may have a N pole and a S pole, and the N pole and the S pole may be disposed adjacent to each other in a Z axis direction. A second magnetic body M2 may have a S pole and a N pole, and the S pole and the N pole may be disposed adjacent to each other in the Z axis direction. That is, polarities of the second magnetic body M2 may be disposed reversely to polarities of the first magnetic body M1. A third magnetic body M3 may have a N pole and a S pole, and the N pole and the S pole may be disposed adjacent to each other in the Z axis direction. That is, polarities of the third magnetic body M3 may be disposed reversely to the polarities of the second magnetic body M2 and may be disposed in the same manner as the polarities of the first magnetic body M1. The polarities of the first magnetic body M1, the second magnetic body M2, and the third magnetic body M3 may be disposed to be staggered from each other.

If the plurality of magnetic bodies M is disposed, magnetic field lines provided by the respective magnetic bodies M may cancel each other out, and thus an entire strength or an entire length of magnetic field lines provided by the plurality of magnetic bodies M may decrease. Further, if the plurality of magnetic bodies M is disposed adjacent to each other, predetermined distances D1 and D2 need to be maintained to minimize the fore of attraction or repulsion acting between the magnetic bodies M.

FIG. 13 illustrates distribution of magnetic field lines provided by a plurality of magnetic bodies 230 and 240 that is disposed on the plate 220. The first magnetic body 230 may have a N pole and a S pole, and the N pole and the S pole may be disposed adjacent to each other in a X axis direction. The second magnetic body 240 may have a S pole and a N pole, and the S pole and the N pole may be disposed adjacent to each other in the X axis direction. That is, polarities of the second magnetic body 240 may be disposed reversely to polarities of the first magnetic body 230. For example, the N pole and the S pole of the first magnetic body 230 may be sequentially disposed along the X axis direction, and the S pole and the N pole of the second magnetic body 240 may be sequentially disposed along the X axis direction.

A strength or a length of magnetic field lines illustrated in FIG. 13 may be greater than the strength or the length of magnetic field lines illustrated in FIG. 12.

Hence, a performance of the switch can be improved by improving the cancellation of magnetic field lines generated when the plurality of the magnetic bodies is disposed adjacent to each other. Further, miniaturization of the switch can be achieved by reducing a distance that has to be maintained between the plurality of magnetic bodies.

In addition, as the polarities provided by the plurality of magnetic bodies increase, reliability of the switch can be improved. According to the above-described embodiments, the improvement in the reliability and the performance of the switch can be achieved at the same time as the miniaturization of the switch.

Referring to FIGS. 14 and 15, if the actuator 200 approaches the body 100, the first hall sensor 131 may sense the first polarity 231 of the first magnetic body 230, the second hall sensor 132 may sense the second polarity 232 of the first magnetic body 230, the third hall sensor 133 may sense the third polarity 242 of the second magnetic body 240, and the fourth hall sensor 134 may sense the fourth polarity 241 of the second magnetic body 240. For example, the first hall sensor 131 may be a N pole hall sensor, the second hall sensor 132 may be a S pole hall sensor, the third hall sensor 133 may be a S pole hall sensor, and the fourth hall sensor 134 may be a N pole hall sensor. The plurality of hall sensors 130 may transfer signals provided to the plurality of hall sensors 130 to an external device through the cable 300.

Some embodiments or other embodiments of the disclosure described above are not exclusive or distinct from each other. Some embodiments or other embodiments of the disclosure described above can be used together or combined in configuration or function.

The above detailed description is merely an example and is not to be considered as limiting the present disclosure. The scope of the present disclosure should be determined by rational interpretation of the appended claims, and all changes within the equivalent range of the present disclosure are included in the scope of the present disclosure.

The invention claimed is:

1. A switch comprising:
a body; and
an actuator configured to provide a magnetic force to the body and induce an electrical switching of the body,
wherein the body includes:
a housing with a first surface; and
a plurality of hall sensors sequentially disposed adjacent to the first surface,
wherein the actuator includes:
a case with a second surface;
a first magnetic body and a second magnetic body sequentially disposed adjacent to the second surface; and
a plate positioned inside the case,
wherein the first magnetic body and the second magnetic body are positioned between the second surface of the case and the plate,
wherein the plate includes an isolation wall between the first magnetic body and the second magnetic body,
wherein the first magnetic body includes:
a first polarity; and
a second polarity opposite to the first polarity,
wherein the second magnetic body includes:
a third polarity; and
a fourth polarity opposite to the third polarity, and
wherein the first polarity, the second polarity, the third polarity, and the fourth polarity are sequentially disposed along the second surface.

2. The switch of claim 1, wherein the second polarity of the first magnetic body faces the third polarity of the second magnetic body.

3. The switch of claim 1, wherein the second polarity of the first magnetic body is the same as the third polarity of the second magnetic body, and
wherein the first polarity of the first magnetic body is the same as the fourth polarity of the second magnetic body.

4. The switch of claim 1, wherein the plurality of hall sensors includes:
a first hall sensor corresponding to the first polarity;
a second hall sensor corresponding to the second polarity;
a third hall sensor corresponding to the third polarity; and
a fourth hall sensor corresponding to the fourth polarity.

5. The switch of claim 4, wherein a distance between the first hall sensor and the second hall sensor is greater than a distance between the second hall sensor and the third hall sensor.

6. The switch of claim 5, wherein the distance between the first hall sensor and the second hall sensor is substantially equal to a distance between the third hall sensor and the fourth hall sensor.

7. The switch of claim 1, wherein a height of the isolation wall is substantially the same as a height of the first magnetic body or a height of the second magnetic body, or
wherein the height of the isolation wall is smaller than the height of the first magnetic body or the height of the second magnetic body.

8. The switch of claim 1, wherein the plate is bent to form the isolation wall such that the isolation wall is formed with the plate as one body.

9. The switch of claim 1, wherein the isolation wall includes:
a first wall adjacent to the first magnetic body;
a second wall adjacent to the second magnetic body; and
a bridge connecting the first wall and the second wall.

10. The switch of claim 1, wherein the plate includes:
a first seating portion depressed on the plate under the first magnetic body; and
a second seating portion depressed on the plate under the second magnetic body.

11. The switch of claim 10, wherein the plate includes:
a first through hole in the first seating portion; and
a second through hole in the second seating portion.

* * * * *